METHOD OF FABRICATING ELECTRICAL CONNECTORS

Filed Nov. 25, 1964

INVENTORS.
EUGENE G. FREEHAUF,
WILLIAM P. DUGAN,
By [signature]
ATTORNEY.

United States Patent Office 3,396,459

Patented Aug. 13, 1968

3,396,459

METHOD OF FABRICATING ELECTRICAL CONNECTORS

Eugene G. Freehauf, Ontario, and William P. Dugan, Monterey Park, Calif., assignors to General Dynamics Corporation, Pomona, Calif., a corporation of Delaware Filed Nov. 25, 1964, Ser. No. 413,689
9 Claims. (Cl. 29—625)

ABSTRACT OF THE DISCLOSURE

A method of making integral conductor paths and through-hole tubes in multilayer positioner boards on which components are to be mounted. According to this method, a temporary backing material of aluminum is applied to the board having at least one internal circuit; holes are formed through the assembly in desired locations; the desired circuit path or paths is formed on the board; the holes are through-plated along with the desired circuit; and the backing material is removed from the assembly to leave through-hole tubes extending from the back of the multilayer positioner board.

This invention relates to electrical connectors, and more particularly to a method of fabricating electrical connectors utilized to interconnect various elements of electrical or electronic apparatus which are adapted to be mounted within a module utilizing a multilayer circuit design.

Devices which serve as a media for attaching electronic components to a circuit in multilayer apparatus such as 3D module construction are known. The end result of such devices is a series of circuits on a multilayer positioner or carrier board with tubes at appropriate places in continuity with these circuits. The function of these tubes is to receive electronic component leads so that they may be connected to the circuits as used in module construction, for example.

This invention provides a method of fabricating the above described devices for multilayer carrier boards and has the following advantages over the presently known construction thereof: (1) the tubes are manufactured as an integral part of the positioner board, which provides stronger units that stand more abuse; (2) there is no chance of mismatch between the hole in the positioner board and the tube as they are one and the same; (3) no "hard tooling" is necessary for limited production as all circuits and tube locations can be transposed directly from engineering drawings; (4) tube height is easy to control because it originates from stable material and a variation in heights, for different applications, can be made easily; (5) tube diameters can be varied to accept different size component leads; and (6) the number of circuits is increased, per given volume, as compared with the known devices.

Therefore, it is an object of the invention to provide a method of fabricating electrical connectors.

A further object of the invention is to provide a unique method of fabricating devices which serve as a media for attaching electronic component leads in multilayer circuits.

Another object of the invention is to provide a fabricating method for producing integral multilayer carrier boards and electronic connector devices.

Another object of the invention is to provide a method of fabricating devices which contain multilayer carrier boards with tubes integral therewith and at appropriate places in continuity with the circuit paths on the carrier boards.

Figure 1:
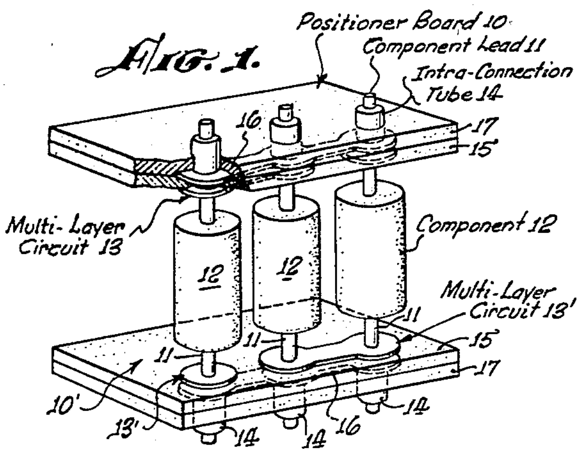
Figure 5:
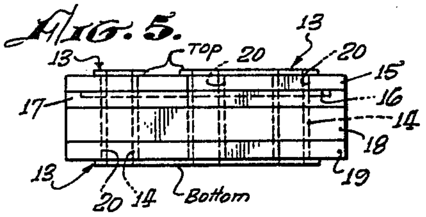

Other objects of the invention will become readily apparent from the following description and accompanying drawings wherein:

FIG. 1 is a view illustrating an application of an electrical connector produced by the invention method; and FIGS. 2–9 illustrate the steps of a manner for carrying out the invention.

Broadly, the invention relates to a method of making integral conductor paths and through-hole tubes in multilayer positioner boards on which components are to be mounted. According to this method, a temporary backing material is applied to the board having at least one internal circuit; holes are formed through the assembly; the desired circuit path or paths is formed on the board; the holes are through-plated along with the desired circuit; and finally the backing material is stripped from the assembly to leave through-hole tubes extending from the back of the multilayer positioner board.

Referring now to the drawings, FIG. 1 illustrates an application of the invention wherein multilayer positioner boards 10 and 10′ made in accordance with the novel method of the invention are intraconnected with leads 11 of a plurality of components 12. Integral with each board 10 and 10′ are multilayer circuits indicated generally at 13 and 13′, respectively, which are interconnected to certain of component leads 11 via intraconnection tubes 14, tubes 14 being made of material such as nickel through which component leads 11 extend. The circuits 13 in the upper board 10 are defined by one layer on the bottom of the board and one layer in the center of the board as shown in dotted lines, while the circuits 13′ in the lower board 10′ comprise an internal layer shown in dotted lines and an external layer on top of the board.

Component leads 11 and tubes 14 are interconnected by welding across the diameter of the tube which provides two welded areas at the inside interfaces of the wall of the tube and the component lead thus giving greater reliability over the single tangential weld obtained with conventional methods. Also, with this type of connection, the welder electrodes are normally in contact with the same type of material, namely, the tube wall, regardless of the type of material which the component leads are made.

The sequence of operation of one manner of carrying out the novel method illustrated in FIGS. 2–9 is as follows:

(1) Bond a sheet 15 of glass epoxy board (FIG. 2), having a circuit 16 formed on one side thereof, to an aluminum sheet 18 having the same thickness as the height of tubes 14. Utilized as a bonding agent is a sheet 17 of stage B epoxy glass laminate, sheets 15 and 17 having a thickness of that of the positioner board 10 or 10′. Circuit 16 may be formed by conventional etching or other known circuit forming methods.

(2) Bond a sheet of glass epoxy board 19 (FIG. 3) or other compatible material (approximately 0.015 inch thick) to aluminum sheet 18 with an adhesive that is nonresponsive to plating.

Figure 4:
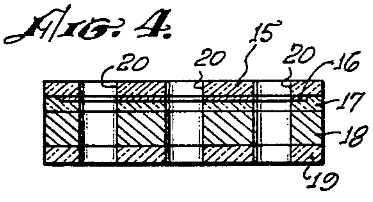

(3) Drill holes 20 of appropriate size (approximately 0.010 inch larger than component lead diameter) through the four bonded pieces (15, 17, 18, 19) at those places requiring a tube 14 in the circuit (see FIG. 4).

(4) Electrocopperplate all exposed aluminum surfaces to approximately 0.0002 inch thick.

(5) Electroless copperplate all surfaces including those plated in (4) above to approximately 0.0001 inch thick.

(6) Electrocopperplate all surfaces to the approximate thickness limits of 0.0015–0.0017 inch.

(7) Form a circuit path or image (FIG. 5) by silk screen or other conventional method on both top and bottom sides of the assembly, the top circuit being the actual circuit, the bottom circuit being a dummy, the dummy circuit being essential to ensure even plating current on both sides of the assembly and thus proper plating of the drilled holes which form the tube walls.

Figure 6:
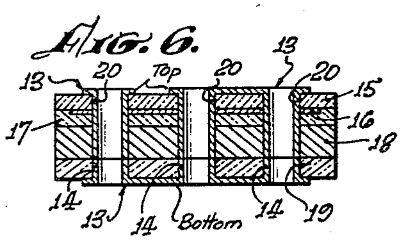
Figure 2:
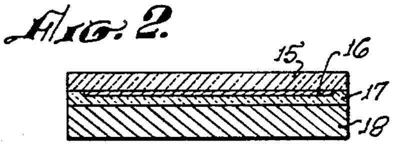

(8) Electroplate with nickel, or other compatible conductive material, all exposed copper surfaces to the required thickness to define the circuits 13 and define tubes 14 having walls of approximately 0.004 inch (FIG. 6).

Figure 7:
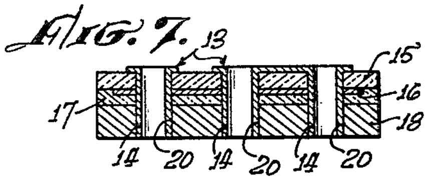
Figure 3:
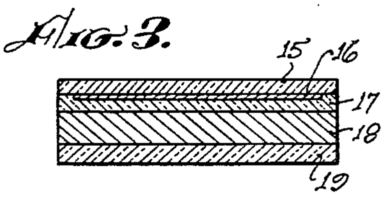

(9) Remove bottom epoxy board 19 and discard (FIG. 7). Remove any of the remaining nonresponsive adhesive from the assembly. Note that the tubes 14 terminate at the aluminum surface 18.

(10) Remove resist from silk screening operation, if such is used to form the circuit path images, by cleaning with suitable solvent.

Figure 8:
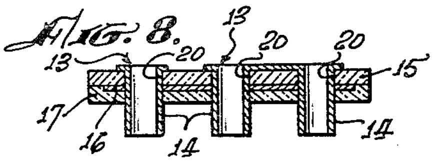

(11) Dissolve aluminum sheet 18 by immersing in sodium hydroxide (FIG. 8).

Figure 9:
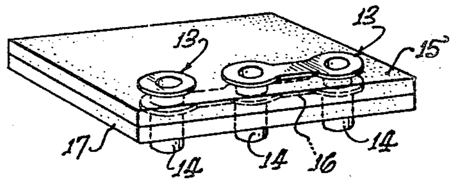

(12) Remove copper from clad board 10 and around tubes 14 by immersing in copper stripper, thus producing an end product as shown in FIG. 9 wherein the nickel tubes 14 are made integral with positioner board 10 and with the combination copper and nickel circuits 13.

The final product illustrated in FIG. 9 is essentially identical with that illustrated in FIG. 1. The configuration of the circuits 13 and the positioning of the tubes 14 is determined by the specific requirements, number of components, types of circuits, etc., of any specific application.

The thickness of the positioner board, the number of internal circuits within the board, and the tube length and diameter are modifications within the scope of this invention and can readily be accomplished by modifying the illustrated manner of carrying out the invention. For example, several layers of circuits can be made by adding combinations of glass epoxy board 15 and stage B epoxy glass laminate 17 with internal circuits 16 positioned as desired.

It has thus been shown that the invention provides a unique method of manufacturing media for attaching electronic components to multilayer circuits having the following advantages: (1) regardless of component lead material, the welder electrodes are always in contact with the same type of material, i.e., the nickel, or equivalent material, in the tube wall which reduces sharply the number of variations in weld schedules for a given system; (2) the tubes are self-aligning with respect to the component leads, eliminating the location and slippage problems which occur when welding round leads to flat ribbon or circuit tabs, and reducing considerably the labor or assembly time; (3) preestablished interconnect circuitry eliminates the possibility of operator-caused wiring errors; and (4) tube welding gives greater reliability by providing two welds inside each tube, instead of the single tangential weld obtained with other systems.

While specific types of materials have been set forth hereinbefore, it is understood that other materials which fulfill the requirements may be utilized.

Although a particular manner of carrying out the invention has been illustrated and described, modifications will become apparent to those skilled in the art, and it is intended to cover in the appended claims all such modifications as come within the spirit and scope of the invention.

We claim:

1. The method of making nickel tubes integral with a positioner board and with multilayer circuits comprising the sequential steps of: forming a circuit on one side of a layer of suitable insulation material, bonding said layer of suitable insulation material to a surface of a layer of aluminum by utilizing as a bonding agent, a second layer of suitable insulation material so the formed circuit is located between the said first and second layers of insulation material, the first and second layers when bonded together defining the desired thickness of the positioner board, bonding another layer of suitable insulation material to the opposite surface of the layer of aluminum with an adhesive that is nonresponsive to plating, drilling holes of appropriate size and number through the bonded assembly at the places requiring a tube, electrocopperplating to a desired thickness all exposed aluminum surfaces, electroless copperplating all surfaces of the assembly to a desired thickness, electrocopperplating to a desired thickness all surfaces of the assembly, forming at least one circuit path on both the top and bottom of the assembly, electroplating with nickel all exposed copper surfaces to a desired thickness thus forming the tube walls, removing the last bonded layer of suitable material and associated nonresponsive adhesive thus forming the terminal ends of the tubes, removing the layer of aluminum by dissolving same, and removing undesirable copper from the positioner board and from around the portion of the tubes which extend from the positioner board.

2. The method defined in claim 1, wherein the first layer of suitable material is of a glass epoxy construction.

3. The method defined in claim 1, wherein the second layer of suitable material is of an epoxy glass laminate construction.

4. The method defined in claim 1, wherein the holes drilled in the assembly are approximately 0.010 inch larger than component lead diameter.

5. The method defined in claim 1, wherein the exposed aluminum surfaces are plated to a thickness of approximately 0.0002 inch.

6. The method defined in claim 1, wherein the surfaces are electroless copper plated to an approximate thickness of 0.0001 inch.

7. The method defined in claim 1, wherein all surfaces of the assembly are electrocopperplated to an approximate thickness of 0.0015 inch.

8. The method defined in claim 1, wherein the tubes are plated to a wall thickness of approximately 0.004 inch.

9. The method defined in claim 1, wherein the layer of aluminum is removed by dissolving by immersion in sodium hydroxide.

References Cited

UNITED STATES PATENTS

| | | | |
|---|---|---|---|
| 3,040,426 | 6/1962 | Hamren. | |
| 3,102,213 | 8/1963 | Bedson et al. | 317—101 X |
| 3,261,769 | 7/1966 | Coe et al. | |
| 3,357,099 | 12/1967 | Nagy et al. | 29—625 |
| 3,060,076 | 10/1962 | Robinson | 204—15 |
| 3,154,478 | 10/1964 | Lee | 204—15 |
| 3,163,588 | 12/1964 | Shortt et al. | 204—16 |
| 3,256,586 | 6/1966 | Douglas et al. | 204—15 |
| 3,345,741 | 10/1967 | Reimann | 204—15 |

JOHN F. CAMPBELL, *Primary Examiner.*

D. C. REILEY, *Assistant Examiner.*